United States Patent
Lee et al.

(10) Patent No.: US 6,410,400 B1
(45) Date of Patent: Jun. 25, 2002

(54) METHOD OF MANUFACTURING $TA_2O_5$ CAPACITOR USING $TA_2O_5$ THIN FILM AS DIELECTRIC LAYER

(75) Inventors: Kee Jeung Lee, Seoul; Kwang Chul Joo, Kyoungki-do, both of (KR)

(73) Assignee: Hyundai Electronics Industries Co., Ltd. (KR)

(*) Notice: Subject to any disclaimer, the term of this patent is extended or adjusted under 35 U.S.C. 154(b) by 0 days.

(21) Appl. No.: 09/708,455

(22) Filed: Nov. 9, 2000

(30) Foreign Application Priority Data

Nov. 9, 1999 (KR) .............................. 99-49503

(51) Int. Cl.[7] .............................................. H01L 21/20
(52) U.S. Cl. ........................ 438/396; 438/3; 438/240
(58) Field of Search ...................... 438/3, 240, 396, 438/397, 398, 253, 254, 255

(56) References Cited

U.S. PATENT DOCUMENTS 5,910,218 A * 6/1999 Park et al.
6,162,744 A * 12/2000 Al-Shareef et al.
6,104,203 A1 * 3/2001 Narwankar et al.

FOREIGN PATENT DOCUMENTS

JP          57167669 A   * 10/1982

* cited by examiner

Primary Examiner—Tuan H. Nguyen
(74) Attorney, Agent, or Firm—Pillsbury Winthrop LLP

(57) ABSTRACT

The present invention discloses a method of manufacturing a $Ta_2O_5$ capacitor with high capacitance using a $Ta_2O_5$ thin film as a dielectric layer. The method according to the present invention, comprising the steps of: providing a semiconductor substrate over which selected lower patterns are formed and an intermediate insulating layer is covered; forming a lower electrode on the intermediate insulating layer; nitrifying the surface of the lower electrode; depositing a $Ta_2O_5$ thin film in an amorphous state on the nitrified surface of the lower electrode; annealing the amorphous $Ta_2O_5$ thin film at a low temperature; annealing the low thermal annealed amorphous $Ta_2O_5$ thin film at a high temperature so as to form a crystalline $Ta_2O_5$ thin film as a dielectric layer; and forming an upper electrode on the dielectric layer made of the crystalline $Ta_2O_5$ thin film.

4 Claims, 2 Drawing Sheets

METHOD OF MANUFACTURING TA$_2$O$_5$ CAPACITOR USING TA$_2$O$_5$ THIN FILM AS DIELECTRIC LAYER

BACKGROUND OF THE INVENTION

1. Field of the Invention

The present invention relates to a method of manufacturing a capacitor for a semiconductor device, and more particularly to a method of manufacturing a capacitor having high capacitance using a Ta$_2$O$_5$ thin film as the dielectric layer.

2. Description of the Related Art

As is well known, a capacitor can function as a storage location for storing data in a memory device such as a DRAM. Such capacitors have a structure in which a dielectric layer is interposed between a lower electrode and an upper electrode. The capacitance of the resulting capacitor is proportional to both the surface area of the electrode and the dielectric constant of the dielectric layer and is inversely proportional to the spacing between the electrodes, i.e., the thickness of the dielectric layer.

The capacitance of the capacitor can, therefore, be increased by increasing the surface area of the electrodes, forming the dielectric layer from a dielectric material having a higher dielectric constant, and/or reducing the thickness of the dielectric layer. Because the extent to which the thickness of the dielectric layer may be reduced without causing dielectric failures is limited, efforts to increase capacitance have generally focused on methods of extending the surface area of the electrode and/or using a dielectric layer having a higher dielectric constant.

The surface area of the electrode can be enlarged by forming a capacitor lower electrode having a 3-dimensional structure, such as cylindrical structures or others that provide increased height, and/or using polysilicon having a hemispherical grain (HSG) surface to increase the effective surface area of the electrode. It is, however, more difficult to manufacture lower electrodes having the hemispherical grain surfaces and/or other 3-dimensional structures. Particularly in those cases in which the height of the lower electrode is increased, the topology between a cell region and a peripheral circuit region is also increased. These height differences can complicate and degrade subsequent processing, particularly with regard to depth of focus and exposure control problems during subsequent photolithography processes.

Therefore, the current effort to manufacture a capacitor having increased capacitance remains mostly focused on methods of developing dielectric layers with higher dielectric constants.

For example, a stacked structure having oxide/nitride/oxide (ONO) layers has been widely used as a dielectric layer. However, a simpler stacked structure having only nitride/oxide (NO) layers has been proposed and used as a dielectric layer in an effort to increase capacitance. Since the dielectric constant ($\epsilon$) of the dielectric layer having the NO structure is about 4~5, capacitors using the NO structure as a dielectric layer can not provide sufficient capacitance to support the next generation DRAM products of more than 256M cells. It is expected that next generation DRAM products will require cell capacitance values on the order of 25fF/cell or more in order to suppress the generation of soft errors and reduce the refresh time. Consequently, a Ta$_2$O$_5$ thin film having high dielectric constant of about 25~27 has been proposed as a replacement for the dielectric layer having the NO structure. Because the dielectric constant of the Ta$_2$O$_5$ thin film is much higher than that of the NO structure, a Ta$_2$O$_5$ capacitor can easily support next generation DRAM products having more than 256M cells.

Successfully using a Ta$_2$O$_5$ thin film as the dielectric layer remains difficult for several reasons.

First, because the Ta$_2$O$_5$ thin film has unstable stoichiometry, an exchangeable Ta atom in an oxygen vacancy state allows some leakage current to be generated in the film with the amount of leakage current varying with the composition ratio of Ta and O in the film. Accordingly, an additional oxidizing process is performed after depositing the Ta$_2$O$_5$ thin film in order to remove the bulk of the oxygen vacancies. This addition step unavoidably complicates the manufacturing process.

Second, the Ta$_2$O$_5$ thin film will oxidize both polysilicon and TiN, two materials commonly used to form the lower and upper electrodes. As a result, oxygen from the Ta$_2$O$_5$ film tends to react with the electrode materials during subsequent thermal processes, thereby forming a low dielectric oxidation layer at the interfaces between the electrodes and the dielectric layer. The formation of these oxide layers degrades both the uniformity of the interfaces and the electrical characteristics of the resulting capacitor.

Third, organic matter from the tantalum (V) ethoxide Ta(OC$_2$H$_5$)$_5$, the precursor compound for the Ta$_2$O$_5$ layer, reacts with O$_2$ or N$_2$O gases to form carbon, carbon compounds such as CH$_4$ and C$_2$H$_4$, and water vapor (H$_2$O) that are, in turn, incorporated into the Ta$_2$O$_5$ thin film as impurities. The presence of these impurities increases leakage current and degrades the capacitor's dielectric characteristics.

SUMMARY OF THE INVENTION

Accordingly, it is an object of the present invention to provide a method of manufacturing a Ta$_2$O$_5$ capacitor that does not require an additional oxidizing process to remove oxygen vacancies in order to produce a Ta$_2$O$_5$ thin film suitable for as a dielectric layer.

It is another object of the present invention to provide a method of manufacturing a Ta$_2$O$_5$ capacitor capable of preventing the generation of a low dielectric oxidation layers produced by the reaction between the electrode material and oxygen inside the Ta$_2$O$_5$ thin film dielectric layer.

It is another object of the present invention to provide a method of manufacturing a Ta$_2$O$_5$ capacitor having improved leakage current characteristics and dielectric characteristics by removing organic contamination from the Ta$_2$O$_5$ thin film.

A method of manufacturing a capacitor according to the present invention to accomplish the aforementioned objects comprises the steps of: providing a semiconductor substrate on which selected lower patterns are formed and covered by an intermediate insulating layer; forming a lower electrode on the intermediate insulating layer; nitrifying the surface of the lower electrode; depositing a Ta$_2$O$_5$ thin film in an amorphous state on the nitrified surface of the lower electrode; annealing the amorphous Ta$_2$O$_5$ thin film at a low temperature; annealing the low temperature annealed amorphous Ta$_2$O$_5$ thin film at a high temperature to form a crystalline Ta$_2$O$_5$ thin film as a dielectric layer; and forming an upper electrode on the dielectric layer comprising the crystalline Ta$_2$O$_5$ thin film.

BRIEF DESCRIPTION OF THE DRAWINGS

The objects, aspects, and advantages of the present invention can be more readily understood with reference to the following detailed description and the attached drawings.

DETAILED DESCRIPTION OF THE INVENTION

Hereinafter, a method of manufacturing a capacitor of a semiconductor device according to the present invention will be described with reference to FIGS. 1A to 1D.

Figure 1A:
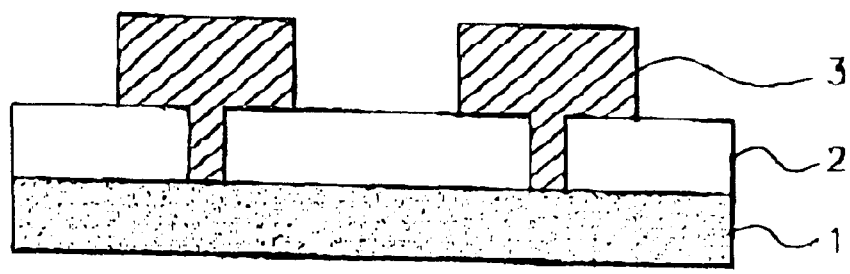
FIGS. 1A to 1D are cross-sectional views for describing a method of manufacturing a capacitor for a semiconductor device according to the present invention.

Referring to FIG. 1A, a semiconductor substrate 1 on which a selected lower pattern, i.e., some basic structures such as transistors and resistors are formed, is prepared. An intermediate insulating layer 2 is then formed on the substrate 1, covering the basic structures. A capacitor lower electrode 3 is then formed on the intermediate insulating layer 2 using known processes. The lower electrode 3 is also in contact with a selected portion of the substrate 1. The lower electrode 3 is preferably made of a doped polysilicon layer and has a stack structure. Alternatively, the lower electrode 3 may be made of one metal layer selected from a group consisting of TiN, TaN, W, WSi, Ru, $RuO_2$, Ir, $IrO_2$ and Pt rather than the preferred doped polysilicon. The lower electrode 3 may also be formed with a 3-dimensional structure such as cylinder an HSG surface to increase its surface area.

Figure 1B:
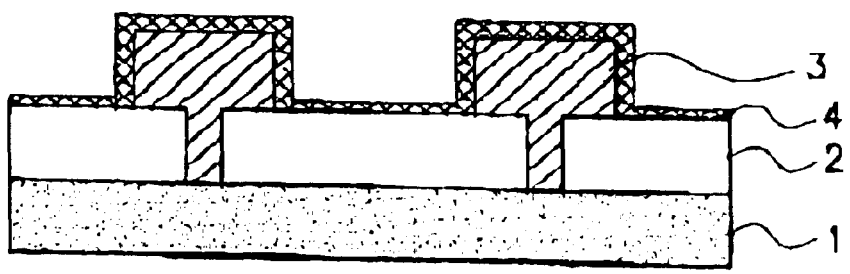

Referring FIG. 1B, the surface of the lower electrode 3 is nitrified to form a nitride layer 4 made by the absorption of nitrogen on the surface of the lower electrode 3 and on the intermediate insulating layer 2. The nitrifying process is intended to prevent unwanted oxidation from occurring at the interface between the lower electrode 3 and a $Ta_2O_5$ thin film during either the formation of the $Ta_2O_5$ thin film or during other subsequent thermal processes.

The nitrifying process is performed by discharging plasma in an LPCVD chamber having an ammonia ($NH_3$) or a forming gas ($N_2/H_2$) atmosphere for about 1 to 5 minutes with the RF power applied being 50~500W the gas flowrate 50 to 500 sccm, and the pressure being 700 to 760 torr. During the nitrifying process, the temperature of the substrate 1 is required to be about 300~500° C. Alternatively, the nitrifying process may be performed by annealing the wafer at a temperature of about 650~950° C. and a rate of rising temperature of about 50~150° C./minute for 30 to 180 seconds under an $NH_3$ atmosphere using a rapid thermal process (RTP). In addition, the nitrifying process may be performed in an electric furnace by annealing the wafer at a temperature of about 500~1,000° C. for 5 to 30 minutes under an $NH_3$ atmosphere.

A cleaning process using HF vapor or HF solution can be performed before the nitrifying process to improve the capacitor characteristics by removing any natural oxide ($SiO_2$) that is present on the surface of the lower electrode 3. A cleaning process using a $NH_4OH$ solution or a $H_2SO_4$ solution can also be performed before and/or after the HF cleaning process to improve the uniformity of the lower electrode 3.

After the nitrifying process, a slightly oxidation process can be performed by annealing the wafer under a $NO_2$ or $O_2$ atmosphere. Herein, the slightly oxidation process is performed in an electric furnace by annealing the wafer at a temperature of about 700~800° C. for 5 to 10 minutes. Also, the slightly oxidation process may be performed by annealing the wafer at a temperature of about 750~950° C. for 30 to 120 sec. using a rapid thermal process (RTP). In addition to the nitrifying process, the a lightly oxidizing process more effectively suppresses unwanted oxidation at the interface between the lower electrode and the $Ta_2O_5$ thin film.

Alternatively, the nitrifying process described above may be omitted. In this case, a silicon nitride layer ($Si_3N_4$) of about 5~30 Å is deposited on the lower electrode 3 and, the $Ta_2O_5$ thin film is then almost immediately deposited on the silicon nitride layer.

Figure 1C:
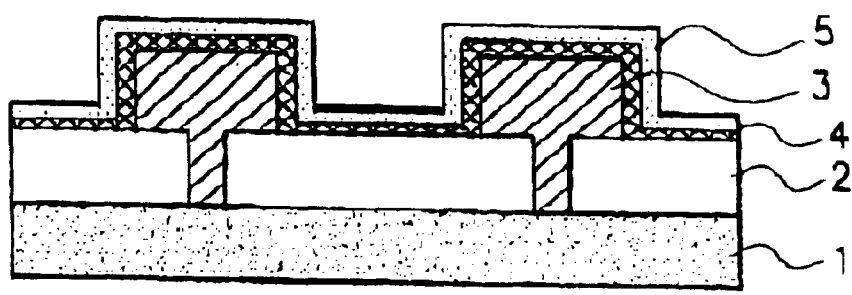

Referring FIG. 1C, a $Ta_2O_5$ thin film is deposited in an amorphous state on the nitride layer 4 that has been formed on lower electrode 3. The amorphous $Ta_2O_5$ thin film is then annealed at a low temperature. After the initial low temperature anneal, the $Ta_2O_5$ thin film is then annealed at a higher temperature, thereby forming crystalline $Ta_2O_5$ thin film 5 that will serve as the dielectric layer for the resulting capacitor.

The amorphous $Ta_2O_5$ thin film is the product of a chemical reaction at the surface of the lower electrode 3 between a selected amounts of a Ta compound vapor and a reaction gas, $NH_3$ (10~1,000 sccm) or $O_2$ (10~300 sccm), in an LPCVD chamber at a temperature of 300~600° C. and at a pressure of less than 10 torr to form a $Ta_2O_5$ film of about 50~15 Å. The predetermined amounts of the reactant gases may be injected using a flow controller such as mass flow controller (MFC). The Ta compound vapor is produced by supplying a $Ta(OC_2H_5)_5$ solution (preferably having a purity of at least 99.99%) into an evaporator or an evaporation tube at a rate preferably less than 100 mg/min using a MFC, evaporating the supplied $Ta(OC_2H_5)$ solution, and then injecting the resulting vapor into the LPCVD chamber through a supply tube. During the operation, the evaporator or the evaporation tube, including any orifice or nozzle, the supply tube, and other surfaces exposed to the Ta compound vapor, are held at a temperature of 150~200° C. in order to prevent condensation of the vaporized Ta compound.

The low temperature annealing process for the amorphous $Ta_2O_5$ thin film is performed at a temperature of 300~500° C. for about 2~10 minutes using $O_3$ or UV-$O_3$ processes. As a result of this annealing process, exchangeable Ta atoms in the $Ta_2O_5$ thin film, i.e., oxygen vacancies are removed and unbound carbon atoms in the amorphous $Ta_2O_5$ thin film are oxidized by available oxygen to form volatile carbon compounds such as CO or $CO_2$.

The subsequent high temperature annealing process for the low temperature annealed amorphous $Ta_2O_5$ thin film is typically performed in furnace having a $N_2O$, $O_2$ or $N_2$ atmosphere at a temperature of about 650~950° C. for between 5 and 30 minutes. During this process, impurities such as volatile carbon compounds and other reaction byproducts are removed from the amorphous $Ta_2O_5$ thin film. The high-temperature anneal process also serves to crystallize and densify the amorphous $Ta_2O_5$ thin film.

Figure 1D:
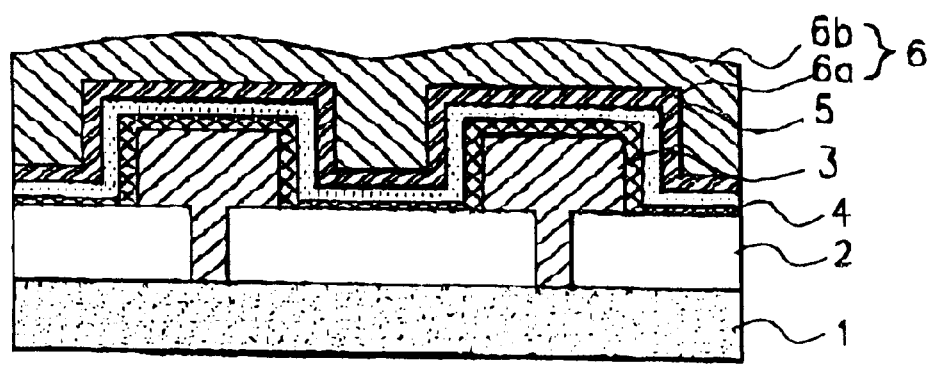

Referring FIG. 1D, a capacitor upper electrode 6 is formed on the $Ta_2O_5$ thin film 5, thereby completing a $Ta_2O_5$ capacitor 10 according to the present invention. The upper electrode 6 is made of a stack structure of a metal layer 6a and a buffer layer 6b. Herein, the metal layer 6a is one selected from a group consisting of TiN, TaN, W, WSi, Ru, $RuO_2$, Ir, $IrO_2$ and Pt, preferably TIN, and has a thickness of about 100~600 Å. The buffer layer 6b preferably comprises a doped polysilicon layer that will prevent the electrical characteristics of the capacitor from being degraded during subsequent thermal processes.

As described above, compared with the conventional $Ta_2O_5$ thin film, the level of oxygen vacancies and carbon impurities in the $Ta_2O_5$ thin film according to the present invention are substantially eliminated or suppressed. As a result the unwanted oxidation reaction between the lower and upper electrodes and the $Ta_2O_5$ dielectric layer is also suppressed. Accordingly, a $Ta_2O_5$ capacitor according to the present invention exhibits both improved leakage current characteristics and improved dielectric characteristics. Further, the $Ta_2O_5$ capacitor according to the present invention provides a dielectric layer having a dielectric constant of about 25~27.

In manufacturing the $Ta_2O_5$ capacitor according to the present invention the lower electrode may be formed using a relatively simple stacked structure and still provide sufficient capacitance. By utilizing this simple stacked structure, the process of forming the lower electrode may be simplified, thereby reducing both process time and manufacturing costs. Further, the traditional rapid thermal process (RTP) and multi-step low temperature oxidation process for the $Ta_2O_5$ thin film may also be omitted, further reducing cost and increasing productivity.

Various other modifications will be apparent to and can be readily made by those skilled in the art without departing from the scope and spirit of the present invention.

What is claimed is:

1. A method of manufacturing a capacitor of a semiconductor device comprising the steps of:

preparing a semiconductor substrate incorporating lower patterns;

covering the semiconductor substrate with an intermediate insulating layer;

forming a lower electrode on the intermediate insulating layer;

nitrifying the surface of the lower electrode;

depositing a amorphous $Ta_2O_5$ thin film on the nitrified surface of the lower electrode;

annealing the amorphous $Ta_2O_5$ thin film at a first temperature;

further annealing the $Ta_2O_5$ thin film at a second temperature, the second temperature being both higher than the first temperature and sufficiently high to form a crystalline $Ta_2O_5$ thin film dielectric layer; and forming an upper electrode on the crystalline $Ta_2O_5$ thin film dielectric layer;

wherein the lower electrode is a conductive layer comprising one conductor selected from a group consisting of TiN, TaN, W, WSi, Ru, $RuO_2$, Ir, $IrO_2$, and Pt.

2. A method of manufacturing a capacitor of a semiconductor device comprising the steps of:

preparing a semiconductor substrate incorporating lower patterns;

covering the semiconductor substrate with an intermediate insulating layer;

forming a lower electrode on the intermediate insulating layer;

nitrifying the surface of the lower electrode;

depositing a amorphous $Ta_2O_5$ thin film on the nitrified surface of the lower electrode;

annealing the amorphous $Ta_2O_5$ thin film at a first temperature;

further annealing the $Ta_2O_5$ thin film at a second temperature, the second temperature being both higher than the first temperature and sufficiently high to form a crystalline $Ta_2O_5$ thin film dielectric layer; and forming an upper electrode on the crystalline $Ta_2O_5$ thin film dielectric layer;

further comprising the step of cleaning the surface of the lower electrode using HF vapor or HF solution before nitrifying the surface of the lower electrode.

3. The method according to claim 2, further comprising the step of cleaning the surface of the lower electrode using an $NH_4OH$ solution or a $H_2SO_4$ solution before or after the HF cleaning step.

4. A method of manufacturing a capacitor of a semiconductor device comprising the steps of:

preparing a semiconductor substrate incorporating lower patterns;

covering the semiconductor substrate with an intermediate insulating layer;

forming a lower electrode on the intermediate insulating layer;

nitrifying the surface of the lower electrode;

depositing a amorphous $Ta_2O_5$ thin film on the nitrified surface of the lower electrode;

annealing the amorphous $Ta_2O_5$ thin film at a first temperature;

further annealing the $Ta_2O_5$ thin film at a second temperature, the second temperature being both higher than the first temperature and sufficiently high to form a crystalline $Ta_2O_5$ thin film dielectric layer; and forming an upper electrode on the crystalline $Ta_2O_5$ thin film dielectric layer;

wherein the capacitor upper electrode has a stacked structure comprising a polysilicon buffer layer over a metal layer.

* * * * *